(12) United States Patent
Kitahara et al.

(10) Patent No.: US 6,538,084 B2
(45) Date of Patent: *Mar. 25, 2003

(54) TETRAFLUOROETHYLENE COPOLYMER AND USE THEREOF

(75) Inventors: Takahiro Kitahara, Settsu (JP); Kozo Asano, Settsu (JP); Kazuo Ishiwari, Settsu (JP); Yoshihide Higashihata, Settsu (JP); Tatsuya Higuchi, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/011,282

(22) Filed: Dec. 11, 2001

(65) Prior Publication Data

US 2002/0128412 A1 Sep. 12, 2002

Related U.S. Application Data

(62) Division of application No. 09/446,651, filed as application No. PCT/JP98/01693 on Apr. 14, 1998, now Pat. No. 6,372,870.

(30) Foreign Application Priority Data

Jun. 23, 1997 (JP) .................................. 9-165679
Dec. 22, 1997 (JP) .................................. 9-353521

(51) Int. Cl.⁷ ................... C08F 214/26; C08F 214/28; C08F 214/18
(52) U.S. Cl. ................... 526/250; 428/421; 428/422; 526/253; 526/254; 526/348.8
(58) Field of Search ............... 526/250, 253, 526/254, 255

(56) References Cited

U.S. PATENT DOCUMENTS

| 4,338,237 A | 7/1982 | Sulzbach et al. |
| 4,381,387 A | 4/1983 | Sulzbach .................... 526/247 |
| 4,678,847 A | 7/1987 | Patel et al. |
| 4,988,540 A | 1/1991 | Bragaw, Jr. ................. 427/155 |
| 5,087,680 A | 2/1992 | Duan ......................... 526/254 |
| 5,427,831 A | 6/1995 | Stevens ...................... 428/36.2 |
| 5,662,972 A | 9/1997 | Shimada ..................... 428/35.7 |
| 5,852,149 A | 12/1998 | Abusleme et al. |
| 5,940,168 A | 8/1999 | Ishii .......................... 355/40 |
| 6,057,014 A | 5/2000 | Fuller ........................ 428/35.7 |
| 6,060,158 A | 5/2000 | Ono .......................... 428/339 |

FOREIGN PATENT DOCUMENTS

| DE | 3610799 A1 | 10/1986 |
| JP | 4998488 | 9/1974 |
| JP | A52-887 | 1/1977 |
| JP | 5224072 | 6/1977 |
| JP | A52-73994 | 6/1977 |
| JP | A54-31492 | 3/1979 |
| JP | A61-159410 | 7/1986 |
| JP | 6258615 | 12/1987 |
| JP | A284408 | 3/1990 |
| JP | A718035 | 1/1995 |
| JP | A725954 | 1/1995 |
| JP | A7173230 | 7/1995 |
| JP | A7173446 | 7/1995 |
| JP | A7173447 | 7/1995 |
| JP | A7228848 | 8/1995 |
| JP | A7297439 | 11/1995 |
| JP | A725952 | 1/1996 |
| JP | A841131 | 2/1996 |
| JP | A8301940 | 11/1996 |
| JP | WO 9945044 | 10/1999 |

Primary Examiner—Fred Zitomer
(74) Attorney, Agent, or Firm—Birch, Stewart, Kolasch & Birch, LLP (57) ABSTRACT

A tetrafluoroethylene copolymer comprising 30 to 81 mole % of tetrafluoroethylene and a 70 to 19 mole % of at least one other monomer, and having terminal carbonate groups at polymer chain ends, which has a melt flow rate of 0.1 to 100 g/10 min. at 200° C. under a load of 5 kg, and a melting point of 90 to 200° C., a laminate comprising a layer of the above tetrafluoroethylene copolymer, and a layer of other material, and a surface film or a transparent filler material for a solar cell, which comprises the above tetrafluoroethylene copolymer is disclosed. The fluororesin can be firmly adhered directly to other materials such as resins, metals, glass, crystalline silicon, polycrystalline silicon and amorphous silicon, while maintaining characteristics such as chemical resistance, solvent resistance, non-tackiness, electrical insulation properties, stain-proofing properties and flame retardance. The fluororesin can also be molded at a lower temperature than conventional fluororesins, and thus can be heat bonded or co-extruded with general purpose resins having low heat resistance.

12 Claims, 2 Drawing Sheets

Unit: mm

TETRAFLUOROETHYLENE COPOLYMER AND USE THEREOF

This application is a divisional of application Ser. No. 09/446,651, filed on Dec. 23, 1999 U.S. Pat. No. 6,372,870 and for which priority is claimed under 35 U.S.C. §120. Application Ser. No. 09/446,651 is the national phase of PCT International Application No. PCT/JP98/01693 filed on Apr. 14, 1998 under 35 U.S.C. §371. The entire contents of each of the above-identified applications are hereby incorporated by reference. This application also claims priority of Application Nos. 165679/1997 and 353521/1997 filed in Japan on Jun. 23, 1997 and Dec. 22, 1997, respectively, under 35 U.S.C. §119.

FIELD OF THE INVENTION

The present invention relates to a tetrafluoroethylene copolymer. In particular, the present invention relates to a tetrafluoroethylene copolymer which has good transparency and can be adhered to substrates made of various organic and inorganic materials, and a laminate, a film and a surface film or a transparent filler of a solar cell comprising the same.

BACKGROUND ART

Conventionally used fluororesins for molding include tetrafluoroethylene-hexafluoropropylene copolymers (FEP), tetrafluoroethylene-perfluoro(alkyl vinyl ether) copolymers (PFA), tetrafluoroethylene-ethylene copolymers (ETFE), and the like.

Such fluororesins are widely used in various fields such as automobiles, industrial machines, office automation equipment, electric or electronic devices, etc. since they have good heat resistance, chemical resistance, solvent resistance, weather resistance, sliding properties, electrical insulation properties, flame retardance, etc.

However, fluororesins has drawbacks such that they have insufficient mechanical strength or dimensional stability, or they are expensive.

Thus, it has been investigated to adhere or laminate a fluororesin to other organic or inorganic materials in order to make the best use of its advantages but minimize its disadvantages.

However, since fluororesins have small surface energies, they have poor affinity with other materials, and small adhesion force. Thus, it is difficult to directly adhere fluororesins to other materials or substrates. When fluororesins are heat bonded to other materials, the bond strength is still insufficient.

To adhere fluororesins to other materials, the following methods are investigated:

1. The surface of a fluororesin film is treated by sodium etching, plasma treatment, or photochemical treatment, and then the film is adhered to a substrate.

2. The surface of a substrate is physically roughened by sand blasting, etc., and then the substrate is adhered to a fluororesin material.

3. A fluororesin material and a substrate are adhered with an adhesive.

The above methods 1 and 2 require the pretreatment, and the whole steps become complicated, and thus they have low productivity. In addition, the methods 1 and 2 achieve insufficient bond strength, and cause some problems in the appearance of a laminate, such as coloring or easy damaging.

Various adhesives have been investigated for use in the above method 3. In general, adhesives comprising hydrocarbons have insufficient adhesion properties with fluororesins, and thus the adhesive layers of laminates have insufficient chemical resistance, water resistance and weather resistance. Accordingly, the laminates lose the adhesion strength due to the change of temperature or environmental conditions, and thus have low reliability.

Conventional fluororesins should be molded at a temperature of 300° C. or higher, since they have a melting point of 250° C. or higher. Such a molding temperature is higher than the appropriate molding temperatures of general-purpose resins (e.g. polyamide, polyester, polymethacrylate, polyvinyl chloride, polystyrene, ABS, polyacetal, polycarbonate, epoxy resin, polyurethane, etc.) and fiber-reinforced plastics (FRP) comprising such general-purpose resins.

Thus, a temperature of not lower than 300° C. is necessary to heat bond the films of such general-purpose resins and the films of the fluororesins. However, the general-purpose resins are decomposed at such a high temperature to cause foaming or coloring, which are practically unpreferable. It is difficult to co-extrude general-purpose resins and fluororesins to form a multilayer laminate, since they have different molding temperatures as explained above.

It is known for a long time to copolymerize tetrafluoroethylene with various comonomers to modify the properties of polytetrafluoroethylene.

For example, JP-A-49-98488 discloses a terpolymer comprising 20 to 30 mole % of tetrafluoroethylene (TFE), 40 to 60 mole % of ethylene (Et) and 10 to 30 mole % of hexafluoropropylene (HFP). This patent publication describes that the advantageous properties of this terpolymer can be attained only in the specified composition range. A terpolymer prepared in an Example contains 46 to 50 mole % of Et. Thus, the content of TFE is relatively low, and thus the terpolymer has low weather resistance, chemical resistance, flame retardance, non-tackiness and stain resistance which are the inherent properties of fluororesins.

U.S. Pat. No. 4,338,237 discloses a method for the preparation of a stabilized aqueous colloidal dispersion containing a TFE-Et-HFP terpolymer. The monomeric composition of the terpolymer is 30 to 60 mole % of TFE, 40 to 60 mole % of Et and 0 to 15 mole % of HFP. A terpolymer prepared in an Example contains 4.5 or 4.7 mole % of HFP, and 46.5 or 46.8 mole % of Et. However, the specification of this U.S. Patent includes no description indicating a polymer composition which improves the adhesion properties of a terpolymer to various substrates.

JP-A-8-41131 discloses a terpolymer comprising 45 to 55 mole % of TFE, 10 to 20 mole % of HFP and 25 to 40 mole % of Et and having a melting point of about 140 to 170° C. This patent publication does not describe the use of a peroxycarbonate as a polymerization initiator, or the formation of terminal carbonate groups as polymer chain terminal groups.

JP-B-52-24072 discloses the suspension polymerization of TFE, HFP and Et, and describes a monomeric composition of 20 to 80 mole % of TFE, 2 to 30 mole % of HFP and 20 to 60 mole % of Et. However, this patent publication describes no properties of the polymer other than a melting point.

Recently, the exhaustion of fossil energy sources such as petroleum and coal is one of crucial issues. Furthermore, environmental disruption such as the greenhouse phenomenon of the earth caused by carbon dioxide generated on combustion of petroleum or coal is an important problem in either advanced countries or developing countries. Under such circumstances, solar power generation systems have been put to practical use as alternative energy sources, which use the inexhaustible solar radiation energy.

However, the solar power generation systems are not widely spread since the production cost of solar batteries is high. Therefore, it is necessary to increase the photoelectric conversion efficiency of a whole solar cell module or to improve production and processing processes of the solar cell module, in addition to the improvement of the photoelectric conversion efficiency of photovoltaic elements such as crystalline silicon, polycrystalline silicon, amorphous silicon, copper-indium selenide, compound semiconductors, etc.

In particular, the properties of coating materials for photovoltaic elements, for example, transparency, have an intimate relationship with the increase of the photoelectric conversion efficiency of a whole solar cell module or the improvement of the production and processing processes of the solar cell module.

Figure 3:
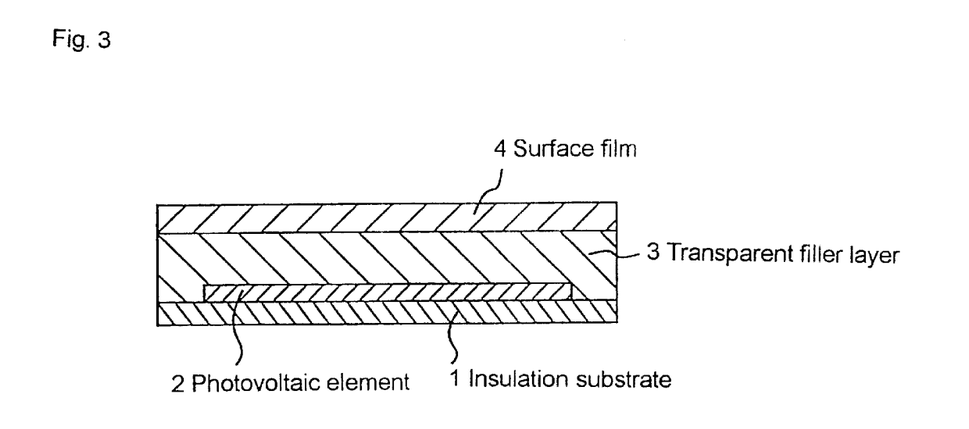
FIG. 3 is a schematic cross sectional view of the fundamental structure of a solar cell module.

FIG. 3 shows a schematic cross section of a basic structure of a solar cell module. In this module, the photovoltaic element 3 is provided on the insulating substrate 4, and the transparent filler layer 2 as a protective layer of the photovoltaic element 3, and also the surface film 1 as an outermost layer (exposed on the surface of the module) are provided over the photovoltaic element 3. Accordingly, the surface film should have good light transmission, and also good weather resistance and heat resistance, since it is exposed to the sun light in the outdoors for a long time. Furthermore, the surface film is required to have impact resistance so that it can protect the photovoltaic element from external impact, anti-adhesion properties against foreign materials which deteriorate the transparency of the film, and stain-proofing properties so that such foreign materials are easily removed. In addition, when the surface film is adhered to a transparent filler layer or directly to a photovoltaic element, it should have adhesion properties with the filler layer or the photovoltaic element.

In view of such requirements, JP-A-7-297439 discloses a solar cell module which uses a surface film 1 made of a fluorine-containing polymer (e.g. a tetrafluoroethylene-ethylene copolymer (ETFE), polychlorotrifluoroethylene (PCTFE), a tetrafluoroethylene-perfluoroalkyl vinyl ether copolymer (PFA), polyvinyl fluoride (PVF), polyvinylidene fluoride (PVDF), a tetrafluoroethylene-hexafluoropropylene copolymer (FEP), a vinylidene copolymer, etc.), and a filler layer 2 comprising an ethylene-vinyl acetate (EVA) or a butyral resin. However, the fluorine-containing polymer inherently has low adhesion properties with other materials, and as the result, the surface film 1 and the filler layer 2 slip off, or peel off.

Thus, there are proposed an invention which uses, as an adhesive, a fluorine-containing polymer to which a hydrocarbon monomer having a carboxyl group, a carboxylic acid anhydride group, an epoxy group or a hydrolyzable silyl group such as maleic anhydride or vinylmethoxysilane is grafted (e.g. JP-A-7-18035, JP-A-7-25952, JP-A-7-25954, JP-A-7-173230, JP-A-7-173446, JP-A-7-173447, etc.) , or an invention using, as an adhesive between polyvinyl chloride and ETFE which is treated by corona discharge, cured adhesive composition comprising an isocyanate curing agent and a fluorine-containing polymer obtained by copolymerizing a hydrocarbon monomer having a functional group such as a hydroxyalkyl vinyl ether, with tetrafluoroethylene or chlorotrifluoroethylene (e.g. JP-A-7-228848).

Such adhesive compositions, which contains the fluorine-containing polymer comprising the grafted or copolymerized hydrocarbon monomer having a functional group, have insufficient heat resistance. Thus, they decompose or form bubbles so that the adhesion strength tends to decrease, or the film or layer is peeled off or discolored, when a composite comprising a fluorine-containing resin film is processed at a high temperature in the production process of the composite.

SUMMARY OF THE INVENTION

The first object of the present invention is to provide a fluororesin which can firmly be adhered directly to other materials such as general-purpose resins, metals, glass, crystalline silicon, polycrystalline silicon, amorphous silicon, etc. while maintaining the good properties of the fluororesin such as chemical resistance, solvent resistance, non-tackiness, electrical insulation properties, stain-proofing properties and flame retardance.

The second object of the present invention is to provide a fluororesin which can be molded at a lower temperature than conventional fluororesins, and thus can be heat bonded or co-extruded with general-purpose resins having low heat resistance.

The third object of the present invention is to provide a fluororesin having a very high transparency in comparison with conventional fluororesins.

The fourth object of the present invention is to provide a surface film or a transparent filler material for a solar cell, which has good molding and processing properties, weather resistance, adhesion properties and transparency.

The fifth aspect of the present invention is to provide a laminate comprising a fluororesin layer, in which layers are firmly bonded.

Accordingly, the present invention provides a tetrafluoroethylene copolymer comprising 30 to 81 mole % of tetrafluoroethylene and a 70 to 19 mole % of at least one other monomer, and having terminal carbonate groups at polymer chain ends, which has a melt flow rate of 0.1 to 100 g/10 min. at 200° C. under a load of 5 kg, and a melting point of 90 to 200° C., a laminate comprising a layer of the above tetrafluoroethylene copolymer, and a layer of other material, and a surface film or a transparent filler material for a solar cell, which comprises the above tetrafluoroethylene copolymer.

In one preferred embodiment, the contents of tetrafluoroethylene and at least one other monomer in the tetrafluoroethylene copolymer are 40 to 81 mole %, and 60 to 19 mole %, respectively, the melt flow rate of the copolymer is 1.0 to 100 g/10 min. at 200° C. under a load of 5 kg, and the copolymer has a critical shear rate of 10 to $10^3$ sec$^{-1}$ at 230° C.

DETAILED DESCRIPTION OF THE INVENTION

One of the characteristics of the tetrafluoroethylene copolymer of the present invention is that it has good adhesion properties with other materials. Such good adhesion properties are assumed to be based on the polymer chain end structures and the melt viscosity characteristic of the copolymer.

The polymer chain ends of the tetrafluoroethylene copolymer of the present invention have terminal carbonate groups. Such terminal carbonate groups can be introduced by the use of a peroxycarbonate as a polymerization initiator.

The terminal carbonate groups significantly improve the adhesion properties of the tetrafluoroethylene copolymer of the present invention with other materials.

The terminal carbonate groups have a high reactivity with polyamide bonds of a backbone or terminal amino or carboxyl groups when the other material is polyamide; with ester bonds of a backbone or terminal hydroxyl or carboxyl groups when the other material is aromatic polyester; or with hydroxyl or carboxyl groups in a backbone when the other material is an epoxy resin.

A tetrafluoroethylene copolymer has good adhesion properties, when the content of terminal carbonate groups contributing to the adhesion is 0.7 or larger, which content is expressed by a ratio of the height of an absorption peak at 1,808 cm$^{-1}$ due to the terminal carbonate groups to the height of an absorption peak at 2,881 cm$^{-1}$ due to the CH$_2$ groups in the backbone (1,808 cm$^{-1}$/2,881 cm$^{-1}$).

This ratio is preferably from 0.7 to 5.0, more preferably from 1.0 to 3.0.

When this ratio increases, the molecular weight of the copolymer decreases. When this ratio exceeds the above upper limit, the mechanical strength of the copolymer unpreferably deteriorates from the practical viewpoint.

The above "height of an absorption peak" means the length of a line between the highest point of the peak, and an intersection of a perpendicular line drawn from the highest point of the peak and a line connecting the both foots of the peak.

What is important in the present invention is that the tetrafluoroethylene copolymer of the present invention can be fusion bonded with a substrate of other material such as general-purpose resins at a temperature at which the other material is not thermally decomposed. Thus, the tetrafluoroethylene copolymer of the present invention should have a viscosity such that it can sufficiently flow at such a temperature. For example, the preferable fusion bonding temperature of a general-purpose resin such as polyamide (Nylon) 12, polyamide 6, polybutyrene teraphtharate or polymethacrylate is between about 150 and 260° C. Thus, the tetrafluoroethylene copolymer of the present invention should be molten and have a melt viscosity which enables the flowing of the copolymer in such a temperature range.

Accordingly, the tetrafluoroethylene copolymer of the present invention has a melt flow rate (MFR) of 0.1 to 100 g/10 min., preferably 1.0 to 100 g/10 min., more preferably 1.0 to 50 g/10 min., when measured at 200° C. under a load of 5 kg, and a melting point of 90 to 200° C.

Furthermore, the tetrafluoroethylene copolymer of the present invention has a critical shear rate of from 10 to 10$^3$ sec$^{-1}$ at 230° C., and therefore, it can be shaped at a lower temperature than conventional fluororesins. Because of such a critical shear rate, the tetrafluoroethylene copolymer of the present invention as such can be shaped or molded in the form of a film, a tube, a pipe, etc., and furthermore it can be co-extruded with general-purpose resins.

In one preferred embodiment, the tetrafluoroethylene copolymer of the present invention comprises 40 to 81 mole % of TFE, 6 to 43 mole % of Et, and 10 to 30 mole % of HFP.

When the content of TFE is too large, a polymerizatin rate decreases. A more preferable composition of the tetrafluoroethylene copolymer of the present invention is 40 to 60 mole % of TFE, 24 to 43 mole % of Et and 10 to 30 mole % of HFP.

The melting point and also crystallinity of the tetrafluoroethylene copolymer of the present invention continuously decrease as the content of HFP increases. Thus, the transparency of the copolymer improves.

In another preferred embodiment, the tetrafluoroethylene copolymer of the present invention may comprise, as a modifier monomer, a fluorovinyl compound of the formula:

$$CH_2=CFRf \qquad (I)$$

wherein Rf is a fluoroalkyl group having 2 to 10 carbon atoms, in addition to TFE, Et and HFP.

When the number of the carbon atoms of Rf is less than 2, the tetrafluoroethylene copolymer is not sufficiently modified (for example, the suppression of cracking of molded articles in the molding process of the copolymer). When the number of the carbon atoms of Rf exceeds 10, the polymerization reactivity may decrease. Thus, the number of the carbon atoms of Rf is preferably 2 to 10.

Most preferably, a Rf group is a perfluoroalkyl group, or a ω-hydro- or ω-chloroperfluoroalkyl group from the viewpoint of the heat resistance of an obtained copolymer.

Among such fluorovinyl compounds, a fluorovinyl compound of the formula:

$$CH_2=CF(CF_2)_nH \qquad (II)$$

wherein n is a number of 2 to 10 is preferable, and a compound of the formula (II) in which n is a number of 3 to 5, is more preferable, from the viewpoint of the copolymerizability, the cost of the monomer preparation, and the properties of the obtained copolymer.

When a fluorovinyl compound (I) is used as a modifier monomer, the monomer composition is such that the molar ratio of tetrafluoroethylene to etylene is from 40:60 to 90:10, the content of the fluorovinyl compound is 0 to 10 mole % (based on the whole copolymer), and the content of hexafluoropropylene is 10 to 30 mole % (based on the whole copolymer).

The tetrafluoroethylene copolymer of the present invention may be prepared by a polymerization method which is conventionally employed for the preparation of ETFE.

To introduce carbonate groups at polymer chain ends, a peroxycarbonate is used as a polymerization initiator in the preparation of the tetrafluoroethylene copolymer of the present invention. As a peroxycarbonate, compound of the following formulae (1) to (4) are preferably used:

(1)

(2)

-continued (3)

(4)

wherein R and R' are a straight or branched monovalent saturated hydrocarbon group having 1 to 15 carbon atoms or a straight or branched monovalent saturated hydrocarbon group having 1 to 15 carbon atoms and an alkoxyl group at its end, R" is a a straight or branched divalent saturated hydrocarbon group having 1 to 15 carbon atoms or a straight or branched divalent saturated hydrocarbon group having 1 to 15 carbon atoms and an alkoxyl group at its end.

In particular, diisopropyl peroxydicarbonate, di-n-propyl peroxydicarbonate, tert.-butyl peroxyisopropylcarbonate, bis (4-tert.-butylcyclohexyl) peroxydicarbonate, di-2-ethylhexyl peroxydicarbonate, etc. are preferable.

For the industrial preparation, a preferable polymerization method is suspension polymerization in an aqueous medium using a fluorine-containing solvent and a perooxycarbonate as a polymerization initiator, although other polymerization methods such as solution polymerization, bulk polymerization, etc. may be employed.

Examples of fluorine-containing solvents include hydrochlorofluoroalkanes (e.g. $CH_3CClF_2$, $CH_3CCl_2F$, $CF_3CF_2CCl_2H$, $CF_2ClCF_2CFHCl$, etc.), chlorofluoroalkanes (e.g. $CF_2ClCFClCF_2CF_3$, $CF_3CFClCFClCF_3$, etc.), and perfluoroalkanes (e.g. perfluorocyclobutane, $CF_3CF_2CF_2CF_3$, $CF_3CF_2CF_2CF_2CF_3$, $CF_3CF_2CF_2CF_2CF_2CF_3$, etc.) Among them, perfluoroalkanes are preferable.

The amount of a solvent used is preferably from 10 to 100 wt. % of water from the viewpoint of suspension properties and costs.

A polymerization temperature is not limited, and may be 0 to 100° C. In general, a lower temperature is preferable to avoid the deterioration of heat resistance due to the formation of ethylene-ethylene chains in the copolymer.

A polymerization pressure depends on other polymerization conditions such as the kind, amount and vapor pressure of a solvent used, a polymerization temperature, etc. In general, the polymerization pressure is 0 to 50 $kgf/cm^2G$.

In the preparation of the tetrafluoroethylene copolymer of the present invention, for the control of a molecular weight, it is possible to use a conventional chain transfer agent, for example, hydrocarbons such as isopentane, n-pentane, n-hexane, cyclohexane, etc.; alcohols such as methanol, ethanol, etc.; and halohydrocarbons such as carbon tetrachloride, chloroform, methylene chloride, methyl chloride, etc.

Examples of materials with which the tetrafluoroethylene copolymer of the present invention can be laminated include:

fluororesins (other than the tetrafluoroethylene copolymer of the present invention); thermoplastic resins such as polyamide (e.g. Nylon 6, Nylon 66, Nylon 11, Nylon 12, Nylon 610, Nylon 46, Nylon 612, etc.), polyester (e.g. polybutylene teraphthalate, polyethylene teraphthalate, etc.), polycarbonate, polyacetal, poly (meth) acrylate, styrene resins, ABS resins, polyvinyl chloride, ethylene-vinyl alcohol resins, cellulose plastics, modified polyphenylene ether;

thermosetting resins such as epoxy resins (e.g. glycidyl ether epoxy resins, glycidyl ester epoxy resins, glycidyl amine epoxy resins, etc.), unsaturated polyester resins, phenol resins (e.g. novolak resins), polyurethane resins, silicone resins, silicious materials such as glass (e.g. hard glass, soft glass, glass fiber, etc.), crystalline silicon, polycrystalline silicon, amorphous silicon, clays, cement;

metallic materials such as aluminum-based metallic materials, iron-based metallic materials, copper-based metallic materials, nickel, titanium;

synthetic rubbers; natural fiber; wood; paper; leathers.

Among the other materials with which the tetrafluoroethylene copolymer of the present invention can be laminated, the most firmly adhered materials are polymer materials having amide groups and/or epoxy groups in the polymer chains. Using such a polymer material as an intermediate layer, three or more multilayer laminates comprising at least one layer of the tetrafluoroethylene copolymer of the present invention can be formed.

When the tetrafluoroethylene copolymer of the present invention is laminated on the surface of an article formed from a polyamide resin, it is possible to impart various properties such as solvent resistance, and chemical resistance and impermeability against, in particular, modified gasoline containing alcohols (e.g. methanol, ethanol, etc.) or methyl tert.-butyl ether.

Examples of polymer materials having amide groups in the polymer chains, which are used to form an intermediate layer of a laminate, include (1) polyamide resins, (2) polyamide elastomers and (3) polyamide resin alloys.

Specific examples are as follows:

(1) polyamide resins prepared by ring opening polymerization of cyclic aliphatic lactams; by condensation of aliphatic diamines and aliphatic or aromatic dicarboxylic acid; by polycondensation of amino acids; by copolymerization of short-chain dibasic acids and dimer acids comprising dicarboxylic acids having 36 carbon atoms which are obtained by dimerization of unsaturated fatty acids.

For example, Nylon 6, Nylon 66, Nylon 10, Nylon 612, Nylon 46, Nylon 34, Nylon 69, Nylon 12, Nylon 11, Nylon 4, and copolymer polyamides such as Nylon 6/610, Nylon 4, Nylon 6/612, Nylon 6/46, Nylon 6/12, Nylon 6/66, Nylon 6/66/610, Nylon 6/46/66, Nylon 6/66/612, Nylon 6/46/610, Nylon 6/46/12, etc.

An average molecular weight of a polyamide resin is usually from 5,000 to 500,000. Among these polyamide resins, polyamide 11, 12 and 610 are preferably used to produce a laminate tube according to the present invention.

(2) polyamide elastomers such as AB block type polyether ester amide and polyether amide elastomers comprising polyamide components as crystalline hard segments and polyethers as soft segments. These polyamide elastomers can be obtained by condensation of lauryllactam with dicarboxylic acids and tetramethylene glycol.

The carbon numbers of polyamide in the hard segments and those of the soft segments, and the ratio of the hard segments to the soft segments, or the molecular weights of those blocks can be freely designed in accordance with the flexibility and elastic recovery of the polyamide elastomers.

(3) polyamide alloys (3.1) polyamide/polyolefin alloys

For example, ZAITEL ST (available from Dupont), LEONA 4300 (available from Asahi Chemical Co., Ltd.), NOPAMID ST 220 (available from Mitsubishi Chemical Corporation), NYLON EX 1020 (available from UNITIKA Ltd.), etc.

(3.2) polyamide/polypropylene alloys

For example, SYSTEMER S (available from SHOWA DENKO K.K.).

(3.3) polyamide/ABS alloys

For example, TOYOLAX SX (available from Toray Industries, Inc.)

(3.4) polyamide/polyphenylene ether alloys

For example, NORYL GTX 600 (available from Nippon GE Plastic), REMALLOY B 40 (available from Mitsubishi Chemical Corporation).

(3.5) polyamide/polyarylate alloys

For example, X9 (available from UNITIKA Ltd.)

Specific examples of polymers having epoxy groups in the backbones include polyethylene resins having epoxy groups (e.g. LEXPEARL RA 3150 available from Japan Polyolefins Co., Ltd.), etc.

Examples of materials which form another layer opposite to the layer of the tetrafluoroethylene copolymer of the present invention through an intermediate layer are as follows:

resins such as polyester, polyamide, polyolefinsulfide, acrylic resins, vinyl acetate resins, polyolefin resins, vinyl chloride resins, polycarbonate, styrene resins, ABS resins, polyamideimide, polyether ether ketone (PEEK), polyethersulfone, polysulfone, polyphenylene oxide (PPO), polyaramide, polyacetal, polyetherimide, silicone resins, polyurethane, polyimide, epoxy resins, phenol resins, amino resins, unsaturated polyeter, cellophane, etc.;

synthetic and natural rubbers such as nitrile-butadiene rubber, isoprene rubber, styrene-butadiene rubber, butadiene rubber, chloroprene-acrylic rubber, ethylene-propylene rubber, urethane rubber, silicone rubber, fluororubber, chlorosulfonated polyethylene rubber, acrylic rubber, epichlorohydrine rubber, polysulfide rubber, chlorinated polyethylene rubber, etc.;

styrene-, vinyl chloride-, olefin-, polyester-, polyamide- and urethane-based thermoplastic elastomers;

metals such as aluminum, iron, nickel, titanium, molybdenum, magnesium, manganese, copper, silver, lead, tin, chromium, beryllium, tungsten, cobalt, and their compounds or alloys;

Specific examples of alloys include alloy steels such as carbon steel, Ni steel, Cr steel, Ni—Cr steel, Cr—Mo steel, stainless steel, silicon steel, Permalloy, etc.; aluminum alloys such as Al—Cl, Al—Mg, Al—Si, Al—Cu—Ni—Mg, Al—Si—Cu—Ni—Mg, etc.; copper alloys such as brass, bronze, silicon bronze, silicon brass, albata, nickel bronze, etc.; and nickel alloys such as nickel-manganese (D nickel), nickel-aluminum (Z nickel), nickel-silicon, Monel metal, constantan, Hastelloy, etc.

To prevent corrosion of metals, the surfaces of metals may be coated with other metals by electroplating, hot-dip coating, chromizing, siliconizing, calorizing, sherardizing, metallizing, etc., by forming a phosphate layer through phosphatizing, by forming metal oxides through anodizing or thermal oxidizing, or by galvanic corrosion.

To further improve the adhesion properties, metal surfaces may be subjected to formation with phosphate salts, sulfuric acid, chromic acid, oxalic acid, etc., or surface-roughened by sand blast, shot blast, grit blast, honing, paper scratch, wire scratch, hairline treatment, etc.

Examples of aluminum based metal materials include aluminum, aluminum oxides, and aluminum alloys for casting or flatting, such as Al—Cu alloy, Al—Si alloy, Al—Mg alloy, Al—Cu—Ni—Mg alloy, Al—Si—Cu—Ni—Mg alloy, high tensile aluminum alloy, anticorrosive aluminum alloy, etc. may be used. Furthermore, the above aluminum or its alloys may be anodized with sodium hydroxide, oxalic acid, sulfuric acid, cromic acid, etc. to form anoxide film (anodized aluminum), or surface treated as described above, to improve anticorrosion properties, surface hardness and adhesion properties.

Examples of iron based materials include iron, iron oxides, carbon steel, Ni steel, Cr steel, Ni—Cr steel, Cr—Mo steel, Ni—Cr—Mo steel, stainless steel, silicon steel, Permaloy, magnetic steel, cast iron, etc.

Furthermore, the above iron based materials the surfaces of which are plated with other metals, for example, zinc hot-dipped steel sheets, alloyed zinc hot-dipped steel sheets, aluminum plated steel sheets, zinc-nickel plated steel sheets, zinc-aluminum plated steel sheets, etc.; the above iron based materials the surfaces of which are coated with other metals by interfusing, metallizing, etc.; the above iron based materials on which surfaces oxide films are formed by formation with chromic acid or phosphate, or by thermal treatment; the above iron based materials the surfaces of which are subjected to galvanic corrosion (e.g. galvanic steel sheets), and the like may be used.

Glass materials such as crystallized glass, foam glass, heat-ray reflection glass, heat-ray absorbing glass, laminate glass, etc.; ceramic substrates such as tiles, large ceramic plates, ceramic panels, bricks, etc., natural stones such as granite, marble, etc., concrete substrates such as high strength concrete, glass fiber-reinforced concrete (GRC), carbon fiber-reinforced concrete (CFRC), autoclaved light-weight concrete (ALC), composite ALC, etc., cement substrates such as extrusion molded cement, composite molded cement, etc., asbestos slates, porcelain enameled steel sheets, single crystalline silicon, polycrystalline silicon, amorphous silicon, clays, boron materials, carbon materials, and the like.

natural organic materials such as natural fibers, woods, paper, leathers, etc.

The opposite layer may comprise one or more layers. The outer or inner surface of the opposite layer may be colored, printed or etched for the decoration purpose.

Each of the layer of the tetrafluoroethylene copolymer of the present invention, the intermediate layer and the opposite layer may contain any suitable additives such as reinforcing materials, fillers, stabilizers, UV ray absorbers, pigments, etc.

Such additives can improve various properties such as heat stability, surface hardness, abrasion resistance, antistatic properties, weather resistance, etc.

A method for the production of such a laminate is suitably selected according to the forms of the tetrafluoroethylene copolymer of the present invention, the forms of a material for an intermediate layer, the kinds and forms of organic materials, and the kinds and forms of inorganic materials.

For example, when an opposite layer comprises a thermoplastic resin, layers are integrally formed by multilayer co-extrusion to shape a product in the form of a film, a tube, a hose, a bottle or a tank.

Any design may be printed on either surface of the opposite layer of a produced mutilayer film by gravure printing, flexography, silk screen printing or offset printing. Furthermore, a printed film is laminated on a metal plate, a plywood, a plasterboard, an asbestos slate, etc., and used as a decorative panel or a material of a built-in kitchen unit.

When an opposite layer comprises a metal, a rubber, glass or a silicone, an intermediate layer and the layer of the tetrafluoroethylene copolymer of the present invention are beforehand shaped in the form of a film, a tube, a sheet, a hose or a bottle by co-extrusion, and then the opposite layer is laminated on the opposite layer by thermal activation.

An obtained multilayer film or sheet may be used as an insert film skin material in SP mold molding, in-mold molding, etc., and can provide the layer of the tetrafluoroethylene copolymer of the present invention as the outermost layer of a molded article having good weather resistance, stain-proofing properties, moisture resistance and chemical resistance.

Examples of products which can be produced as described above include bumpers, door trims, instrument panels and decorative braids of automobiles; domestic electric appliances; display panels of office automation equipment; electrically illuminated signboards; displays; and mobile phones.

In these years, filler hoses used in filler piping systems of automobiles are shifted from simple rubber (NBR etc.) hoses to laminate hoses of rubbers and polyamide resins, laminate hoses of rubbers and fluororubbers, or simple polyamide hoses, to improve barrier properties against gasoline containing lower alcohols.

However, polyamide resins and fluororubbers have insufficient barrier properties against fuel penetration.

A three-layer hose of the present invention comprising a rubber layer made of, for example, NBR alone or a compound of NBR and polyvinyl chloride, as an opposite and outermost layer, or a four-layer hose of the present invention further comprising a conductive NBR layer as an innermost layer has good barrier properties against fuel penetration, and also good anti-corrosion properties against amines added to fuels. The outermost rubber layers may be reinforced with aramide fibers, etc.

The tetrafluoroethylene copolymer of the present invention can be used in the form of powder. In this case, the powder of the tetrafluoroethylene copolymer of the present invention can be laminated by electrostatic coating on a preliminarily formed laminate film, tube, hose, bottle or tank, which comprises an opposite layer and an intermediate layer.

The tetrafluoroethylene copolymer of the present invention maybe used in the form of an organic solvent dispersion or an aqueous dispersion. Like in the case of powder, the dispersion can be coated on a laminate film, tube, hose, bottle or tank, which comprises an opposite layer and an intermediate layer, by any conventional coating methods.

Recently, as films for agricultural green houses, demands on polyolefin films to substitute vinyl chloride resin films have been increased by taking the influence on environments into consideration. On the other hand, the films of fluororesins (ETFE) having good long-term weather resistance expands their market share. However, the fluororesin films have drawbacks in anti-sticking processability and anti-mist processability, and their improvements are desired.

When polyolefin treated with an anti-sticking agent and an anti-misting agent (a fluorine-containing surfactant, for example, UNIDAIN DS-401 manufactured by Daikin Industries, Ltd.) is used to form an opposite layer of a three-layer film according to the present invention, the laminate film can be used as an agricultural housing film having improved long-term weather resistance, and good anti-sticking and anti-misting properties.

Other applications of laminates are as follows:

When a laminate has an opposite layer formed from polyethyhlene (for example, high density polyethylene) or polyamide, a bottle made of such a laminate can be used as a bottle for chemicals, in particular, chemicals used in the production of semiconductors.

When a laminate film has an opposite layer formed from vinyl chloride resins, polyolefin or paper, it can be use as a wall paper for buildings.

When a laminate has an opposite layer formed from polyester, polyamide or polyolefin, it can be used as a material of umbrellas, rain outfits or artificial turf, which require surface water-repellency.

When a laminate tube or pipe has an opposite layer formed from vinyl chloride resins, it can be used in piping.

The laminates of the present invention may be used as the materials to produce general merchandises, garbage cans, fishery/bleeding tanks, food packaging, bathtubs, modular bath, exhaust fans, lighting fixtures.

A laminate tube having an opposite layer formed from a rubber such as EPDM and an innermost layer formed from the tetrafluoroethylene copolymer of the present invention can be used as a radiator tube having good resistance to a long-life coolant (LLC).

The thickness of a laminate is from 25 to 10,000 $\mu$m, preferably from 40 to 4,000 $\mu$m in the case of a three-layer lamiante.

The thickness of the layer of the tetrafluoroethylene copolymer of the present invention is from 5 to 2,000 $\mu$m, preferably from 10 to 1,000 $\mu$m.

The thickness of an intermediate layer is from 5 to 1,000 $\mu$m, preferably from 5 to 500 $\mu$m, and the thickness of an opposite layer is from 10 to 5,000 $\mu$m, preferably from 15 to 3,000 $\mu$m.

When a film is formed from the tetrafluoroethylene copolymer of the present invention alone, its thickness is determined according to its application and object, and is not specifically limited. The thickness of such a film is generally from 10 to 3,000 $\mu$m, preferably from 20 to 500 $\mu$m, more preferably from 20 to 300 $\mu$m.

A too thin film may require a special production method, or may be difficult to handle in an adhering step, and thus it tends to be wrinkled or broken or to have a bad appearance. In addition, it may have insufficient adhesion strength, mechanical strength and chemical resistance.

A too thick film is disadvantageous from its production cost or workability in adhering it to other materials to integrate them.

The film of the tetrafluoroethylene copolymer of the present invention may contain any suitable additives such as adjuvants, fillers, stabilizers, UV ray absorbers, pigments, etc.

Such additives can improve various properties of the film such as heat stability, surface hardness, abrasion resistance, weather resistance, antistatic properties, etc.

The film of the tetrafluoroethylene copolymer of the present invention may produced by any method, for example, a melt extrusion method, a powder coating method, a method comprising applying an aqueous or organic solvent dispersion of the copolymer on a substrate and forming a continuous film, and the like. In particular, a melt extrusion method is preferable from the viewpoint of productivity and the quality of the obtained film.

The film of the tetrafluoroethylene copolymer of the present invention can be integrated with other materials by various methods, for example, a method comprising laminating the film of the tetrafluoroethylene copolymer and other material and then compression molding them, a method comprising coating one material on the other, a method comprising integrating the other materials to the film when the film is shaped by mutilayer co-extrusion, mutilayer blow molding, insert molding, mutilayer transfer molding or mutilayer injection molding, and the like. Among them, the mutilayer co-extrusion molding and mutilayer blow molding are preferable from the viewpoint of productivity and quality of products.

The layer of the tetrafluoroethylene copolymer of the present invention can be adhered to other material by thermal activation by heating, etc. In particular, thermal fusion bonding is preferable. Typical examples of adhesion methods include heat rolling, heat pressing, etc. Furthermore, it is possible to employ high-frequency heating, microwave heating, vacuum compression (vacuum press), air-press, etc., which may be suitably selected according to the kind and shape of materials and the like.

The film of the tetrafluoroethylene copolymer of the present invention can be produced to have any shape, size and thickness, as described above, and is used in a wide variety of applications because of its good adhesion properties with various materials and good characteristics of the fluororesin.

Specific examples of the applications of the film of the present invention include anticorrosive tapes wrapped around piping of chemical plants, tapes wrapped around pipes in the decks of ships, anticorrosive tapes for other pipes; applications which require weather resistance such as signboards, agricultural greenhouses, roof and wall materials of other green houses, surface materials of outer walls; transparent surface covering materials provided on the light-incoming surfaces of photovoltaic elements of solar cells; interior materials having good anti-staining properties; etc. Furthermore, the films of the present invention can be used in applications which require chemical resistance such as food packaging materials, medicine packaging materials, etc.

In addition, the tetrafluoroethylene copolymer of the present invention can be used in apparatuses or machines which require stain-proofing properties, non-tackiness and low friction such as housings of office automation equipment, food processing machines, cookwares, etc; water- and oil-repellent glass; liquid crystal-related materials such as liquid crystal displays; automobile related materials; and so on.

The laminates comprising the layer of the tetrafluoroethylene copolymer of the present invention and the layer of other material will be explained together with examples of other material.

The layer of other fluororesin and the layer of a thermoplastic resin can be laminated on the layer of the tetrafluoroethylene copolymer of the present invention as an intermediate layer.

Specific examples of the other fluororesins include tetrafluoroethylene-fluoro(alkyl vinyl ether) copolymers (PFA), tetrafluoroethylene-hexafluoropropylene copolymers (FEP), ethylene-tetrafluoroethylene copolymers (ETFE), ethylene-chlorotrifluoroethylene copolymers (ECTFE), propylene-tetrafluoroethylene copolymers, polyvinylidene fluoride (PVDF), vinylidene fluoride copolymers, polychlorotrifluoroethylene (PCTFE), ethylene-fluorine-containing olefin copolymers, etc.

A number average molecular weight of the other fluororesins is usually from 2,000 to 1,000,000. Among these fluororesins, PVDF, vinylidene fluoride copolymers and ethylene-fluorine-containing olefin copolymers, which have relatively low melting points, are preferable.

Vinylidene fluoride copolymers mean copolymers of vinylidene fluoride and at least one other fluorine-containing monomer copolymerizable therewith. Examples of other fluorine-containing monomer copolymerizable with vinylidene fluoride include tetrafluoroethylene (TFE), hexafluoropropylene (HFP), chlorotrifluoroethylene (CTFE), hexafluoroisobutylene, hexafluoroacetone, pentafluoropropylene, trifluoroethylene, vinyl fluoride, fluoro(alkyl vinyl ethers), etc.

Ethylene-fluorine-containing olefin copolymers mean resinous copolymers of ethylene with TFE and/or CTFE in a molar ratio of 10:90 to 60:40. Such copolymers may comprise 0 to 15 mole %, based on the total amount of ethylene and TFE and/or CTFE, of the third fluorine-containing copolymerizable monomer. Examples of the third monomer include compounds of the formula: $CZ_2=CZ(CF_2)_wZ$, $CF_2=CFO(CF_2)_wZ$ wherein Z is a hydrogen atom or a fluorine atom, and w is an integer of 1 to 8), and $CH_2=C(CF_3)_2$.

When PVDF, vinylidene fluoride copolymers or ethylene-fluorine-containing olefin copolymers having a relatively low melting point is co-extrudeds with a polyamide resin as a thermoplastic resin, PVDF, vinylidene fluoride copolymers or ethylene-fluorine-containing olefin copolymers, which have a melt viscosity of 10 to $10^5$ poises measured at 250° C. and a shear rate of 100 $\text{sec}^{-1}$, are preferably used to attain sufficient melt flowability in kneading temperature and molding temperature ranges in which no severe degradation of polyamide is not caused. In particular, ethylene-tetrafluoroethylene copolymers having a melt viscosity of 10 to $10^5$ poises measured at 250° C. and a shear rate of 100 $\text{sec}^{-1}$ have good flexibility and low temperature impact resistance while maintaining the low fuel permeability of a laminate and also they are most suitable to produce laminates with thermoplastic resins and the layer of the tetrfluoroethylene copolymer of the present invention as an intermediate layer by simultaneous multilayer co-extrusion.

Ethylene-tetrafluoroethylene based copolymers, which have a molar ratio of Et to TFE of 10:90 to 38:62 and comprises a third fluorine-containing monomer in an amount of about 0.1 to 5 mole % based on the total weight of Et and TFE, are most preferable since they can decrease the amount of the expensive third fluorine-containing monomer without deteriorating the characteristics of the ethylene-tetrafluoroethylene based copolymers (see JP-B-62-58615).

Each layer of a laminate according to the present invention may contain various fillers such as fiber reinforcing materials (e.g. glass fiber, ceramic fiber, potassium titanate fiber, aramid fiber, aromatic polyester fiber, etc.), inorganic fillers (e.g. calcium carbonate, talc, mica, clay, carbon powder, graphite, glass beads, etc.), metal powder, heat-resistant resins (e.g. polyolefin, polytetrafluoroethylene, polyimide, etc.), colorants, flame retardants, lubrication addtives, etc. The amount of such fillers is from 1 to 70 wt. parts per 100 wt. parts of the resins.

The tetrafluoroethylene copolymer of the present invention has very good adhesion properties to glass materials among the above described silicon materials.

Laminates comprising the layer of the tetrafluoroethylene copolymer of the present invention and the glass material have transparency, and the tetrafluoroethylene copolymer imparts water-repellency, oil-repellency, anti-reflection properties, a low refractive index, etc. to the glass surface. Thus, such laminates can be used as optical parts, liquid crystal-related parts, windshields of automobiles, etc.

The above laminates can be used as fire-retardant safety glass for buildings, which unite flame retardancy, transparency, weather resistance, shatterproof properties, etc.

Hitherto, laminates comprising resin plates on which wool or acrylic fabric is adhered are known as surface materials of interior walls, ceilings or doors of vehicles, aircraft, buildings, etc. However, such laminates have low antiflaming properties, since they use fabric. Thus, it maybe contemplated to use glass fiber fabric as a surface material having good antiflaming properties, but glass fiber fabric may irritate skins. The tetrafluoroethylene copolymer of the present invention can avoid such a disadvantage of the glass fiber fabric, when it is laminated on the glass fiber fabric, since the copolymer of the present invention has good adhesion properties to glass fiber fabric.

As decorative laminates having weather resistance and stain-proofing properties, decorative laminates are known, which are produced by heat laminating a vinyl chloride resin film on an acrylic resin layer of a two-layer film prepared by co-extruding polyvinylidene fluoride and an acrylic resin. However, polyvinylidene fluoride has insufficient solvent resistance and anti-staining properties.

Since the tetrafluoroethylene copolymer of the present invention has the same or better melt extrusion-adaptability as or than polyvinylidene fluoride, it can be co-extruded with an acrylic resin like polyvinylidene fluoride to form a two-layer film, and such a two-layer film is heat laminated on a vinyl chloride resin film or sheet to obtain a decorative laminate, which has good solvent resistance, weather resistance and stain-proofing properties.

A thermoplastic resin layer (e.g. PVC) or a rubber layer (e.g. EPDM) containing a thermoplastic elastomer can be provided on the outer side (the outer layer in the case of hoses, tubes or pipes) or the inner side (the inner layer in the case of hoses, tubes or pipes) of the laminate of the present invention by co-extrusion or after co-extrusion, for the purpose of reinforcing, anti-staining, or providing anti-static properties or low temperature impact resistance.

It is possible to impart flexibility of a tube by corrugating.

Typical examples of the shapes of laminates of the present invention are molded articles such as hoses, pipes, tubes, sheets, gaskets, packing, films, tanks, rolls, bottles, containers, etc., and articles having any shapes can be produced by multilayer co-extrusion, multilayer blow molding or multilayer injection molding.

The laminates of the present invention are preferably used as tubes, pipes or containers for sour gasoline, alcoholic fuels, methyl tert.-butyl ether, gasoline additive (amine, etc.)-containing fuels, inks, paints, waste liquids, high temperature liquids, steam, etc.; or radiator hoses. When a laminate is in the form of a tube, the fluororesin layer preferably forms the innermost layer.

The tetrafluoroethylene copolymer of the present invention can be used as the surface film 1 and/or the transparent filler layer 2 of the solar cell module shown in FIG. 3.

When the tetrafluoroethylene copolymer of the present invention is used as a surface film, its thickness is usually from 10 to 500 $\mu$m, preferably from 30 to 200 $\mu$m.

The surface film may contain therein fiber, non-woven fabric, beads of glass, UV ray absorber, pigments or other suitable additives to such an extent that transparency and weather resistance are not impaired.

A photovoltaic element can be covered directly with the above surface film, or with a transparent filler layer to protect the element from external impact and to improve the adhesion between the element and the surface film.

In the latter case, a transparent filler layer may comprise an ethylene-vinyl acetate copolymer (EVA), an ethylene-methyl acrylate copolymer, an ethylene-ethyl acrylate copolymer, an ethylene-ethyl acrylate-maleic anhydride copolymer, a urethane resin, a butyral resin, a silicone resin, a polyamide resin, a polyester thermoplastic elastomer, a polyolefin thermoplastic elastomer, a polyurethane thermoplastic elastomer, a polyamide thermoplastic elastomer, polyethylene having epoxy groups, a fluororubber, and the like. In particular, EVA is preferable because of its transparency, flexibility, adhesion properties and low cost. EVA which is crosslinked with an organic peroxide is more preferable because of its heat resistance and weather resistance.

When the tetrafluoroethylene copolymer of the present invention is used as a transparent filler layer of a solar cell module, its thickness is usually from 10 to 1,000 $\mu$m, preferably from 50 to 500 $\mu$m. In this case, a surface film made of a conventional fluororesin may be used as a surface film. The transparent filler layer may be compounded with or integrally formed with glass fiber, fabric or beads for the improvement of scratch resistance and impact resistance to an extent that the transparency is not impaired. In addition, the transparent filler layer may contain any additive such as a curing accelerator, a UV ray absorber, etc.

The present invention will be illustrated by the following Examples.

The compositions and properties of the copolymers obtained in Examples were measured as follows:

Monomer Composition in Polymer

The monomer composition of a polymer was determined from an $^{19}$F-NMR chart.

Melting Point

A melting peak was recorded using a SEIKO type DSC (differential scanning calorimeter) when a polymer is heated at a heating rate of 10° C./min., and a temperature corresponding to the highest point was used as a melting point.

MFR

Using a melt indexer (manufactured by TOYO SEIKI SEISAKUSHO KABUSHIKIKAISHA), an amount (g) of a polymer, which flowed out from a nozzle having a diameter of 2 mm and a length of 8 mm in a unit time (10 minutes) at 200° C. under a load of 5 kg, was measured.

IR Spectrum (Absorption Ratio of 1808 cm$^{-1}$/2881 cm$^{-1}$)

Using a Fourier transform IR spectrophotometer, an IR spectrum of a film having a thickness of about 0.4 mm was taken, and then a ratio of the height of an absorption peak at 1,808 cm$^{-1}$ to the height of an absorption peak at 2,881 cm$^{-1}$ was calculated.

Haze Value (Cloudiness)

Using a haze meter (manufactured by TOYO SEIKI SEISAKUSHO KABUSHIKIKAISHA), a haze value was measured with a sample having a thickness of 2 mm.

Critical Shear Rate

Using a capillograph (manufactured by TOYO SEIKI SEISAKUSHO KABUSHIKIKAISHA), a shear rate was measured with a capillary (a die length of 10 mm and a die pore diameter of 1 mm) at 230° C. A shear rate at which a melt fracture started was used as a critical shear rate.

EXAMPLE 1

Deoxidized water (1 liter) was charged in a glass-lined 4 liter autoclave, and the autoclave was evacuated. Then, perfluorocyclobutane (400 g) and hexafluoropropylene (800 g) were charged in the autoclave, and the interior temperature and an agitation speed were maintained at 35° C. and 580 rpm, respectively. Thereafter, CH$_2$=CF(CF$_2$)$_3$H (2.0 g) and cyclohexane (1.5 g) were charged, and then the mixed gas of tetrafluoroethylene, ethylene and perfluorocyclobutane (molar ratio of 78.9:16.6:4.5) was supplied to pressurize the autoclave to 12 kgf/cm$^2$G.

After that, di-n-propyl peroxydicarbonate (8.0g) was charged to initiate the polymerization. As the polymerization proceeded, the pressure dropped. Thus, the mixed gas of tetrafluoroethylene, ethylene and perfluorocyclobutane (molar ratio of 52.8:42.7:4.5) was additionally supplied under pressure, and the polymerization was continued while maintaining the pressure at 12 kgf/cm²G, during which CH$_2$=CF(CF$_2$)$_3$H (1.15 g) was charged by dividing it into 9 portions with a micro-pump. After 5 hours from the initiation of the polymerization, di-n-propyl peroxydicarbonate (4.0 g) was added. The polymerization was carried out for 10 hours in total.

After the termination of the polymerization, the content in the autoclave was recovered and washed with water. Thus, a powdery polymer (127 g) was obtained. The properties of the obtained polymer are shown in Table 1.

EXAMPLE 2

Polymerization was carried out in the same manner as in Example 1 except that the amount of cyclohexane was changed to 0.85 g, and no di-n-propyl peroxydicarbonate was additionally added in the course of the polymerization. After 11 hours of the polymerization, a powdery polymer (137 g) was obtained. The properties of the obtained polymer are shown in Table 1.

EXAMPLE 3

Polymerization was carried out in the same manner as in Example 1 except that the initially charged amounts of perfluorocyclobutane and hexafluoropropylene were changed to 600 g and 600 g, respectively, and the amount of cyclohexane was changed to 1.6 g, and the amount of di-n-propyl peroxydicarbonate was changed to 10.0 g. After 8 hours of the polymerization, a powdery polymer (153 g) was obtained. The properties of the obtained polymer are shown in Table 1.

EXAMPLE 4

Polymerization was carried out in the same manner as in Example 1 except that no perfluorocyclobutane was charged, the initially charged amount of hexafluoropropylene was changed to 1,000 g, and no di-n-propyl peroxydicarbonate was additionally added in the course of the polymerization. After 19 hours of the polymerization, a powdery polymer (130 g) was obtained. The properties of the obtained polymer are shown in Table 1.

Comparative Example 1

Polymerization was carried out in the same manner as in Example 1 except that the amounts of cyclohexane and di-n-propyl peroxydicarbonate were changed to 0.3 g and 6 g, respectively, and no di-n-propyl peroxydicarbonate was additionally added in the course of the polymerization. After 9 hours of the polymerization, a powdery polymer (140 g) was obtained. The properties of the obtained polymer are shown in Table 1.

Comparative Example 2

Polymerization was carried out in the same manner as in Example 1 except that the initially charged amounts of perfluorocyclobutane and hexafluoropropylene were changed to 700 g and 500 g, respectively, and the amount of cyclohexane was changed to 1.5 g. After 4.5 hours of the polymerization, a powdery polymer (136 g).was obtained. The properties of the obtained polymer are shown in Table 1.

Comparative Example 3

Polymerization was carried out in the same manner as in Example 1 except that the initially charged amounts of perfluorocyclobutane and hexafluoropropylene were changed to 1,050 g and 150 g, respectively, the amounts of CH$_2$=CF(CF$_2$)$_3$H, cyclohexane and di-n-propyl peroxydicarbonate were changed to 4.0 g, 5.0 g and 4.0 g, respectively, and no di-n-propyl peroxydicarbonate was additionally added in the course of the polymerization. After 4 hours of the polymerization, a powdery polymer (123 g) was obtained. The properties of the obtained polymer are shown in Table 1.

TABLE 1

| Example No. | Monomer composition TFE/Et/HFP/H$_2$P (mole ratio) | Melting point (° C.) | MFR (g/10 min.) 200° C., 5 kg load | Absorption peak ratio[1] | Haze (%) | Critical shear rate sec$^{-1}$ (230° C.) |
|---|---|---|---|---|---|---|
| Ex. 1 | 46.1:36.5:17.0:0.4 | 161.1 | 10.5 | 1.87 | 12.9 | 360 |
| Ex. 2 | 46.2:35.8:17.5:0.5 | 158.2 | 2.1 | 1.56 | 11.8 | 91 |
| Ex. 3 | 48.8:37.8:13.0:0.4 | 191.8 | 1.5 | 1.12 | 25.3 | 182 |
| Ex. 4 | 41.3:29.2:29.0:0.5 | 111.0 | 46 | 2.11 | 10.0 | 608 |
| C. 1 | 46.1:37.2:16.2:0.5 | 169.1 | unextruded | 0.91 | 12.5 | <6 |
| C. 2 | 49.8:40.4:9.4:0.4 | 211.0 | unextruded | 0.66 | 34.2 | <6 |
| C. 3 | 53.0:43.4:2.8:0.8 | 256.0 | unextruded | 0.28 | 56.9 | unextruded |

Note:
[1] A ratio of the height of an absorption peak at 1,808 cm$^{-1}$ to that at 2,881 cm$^{-1}$

EXAMPLE 5

The polymers obtained in Examples 1 and 2, one obtained in Example 3 and Comparative Example 1, one obtained in Example 4, one obtained in Comparative Example 2, and one obtained in Comparative Example 3 were molten at 200° C., 230° C., 180° C., 250° C. and 300° C., respectively, and pressed with a mold having an inner diameter of 120 mm under a pressure of about 50 kgf/cm². Thus, a sheet having a thickness of 0.5 mm was obtained.

Separately, polyamide 12 (UBE 3035MJ1 (trade name) available from Ube Industries, Ltd.) was pressed in the same manner as above at 200° C. Thus, a sheet having a thickness of 0.5 mm was obtained.

Next, using an automatic welding machine (SDD-FA48 manufactured by SHIMAKURA DENSHI KOGYO KABUSHIKIKAISHA), the sheet of polyamide 12 was heat bonded with each of the sheets obtained from the polymer prepared in Examples 1–4 and Comparative Examples 1–3 by pressing them under a pressure of 0.25 kgf/cm² for 50 seconds at 230° C. which was in a temperature range suitable for molding polyamide 12. Between a part of the laminated sheets, a polyamide film was inserted to leave uncontacted part between the fluororesin and polyamide 12. This part was used as a grasping part in the tensile test.

The peel strength at the bonded part of the welded sheets was measured with an all-purpose Tensilon (manufactured by ORIENTEC KABUSHIKIKAISHA). The measured value was the maximum peel strength. The results are shown in Table 2.

TABLE 2

|  | Peel strength (kgf/cm) |
| --- | --- |
| Example 1 | 5.2 |
| Example 2 | 4.1 |
| Example 3 | 3.2 |
| Example 4 | 4.3 |
| Comp. Ex. 1 | 0.4 |
| Comp. Ex. 2 | 0.1 |
| Comp. Ex. 3 | less than 0.1 |

EXAMPLE 6

Figure 1:
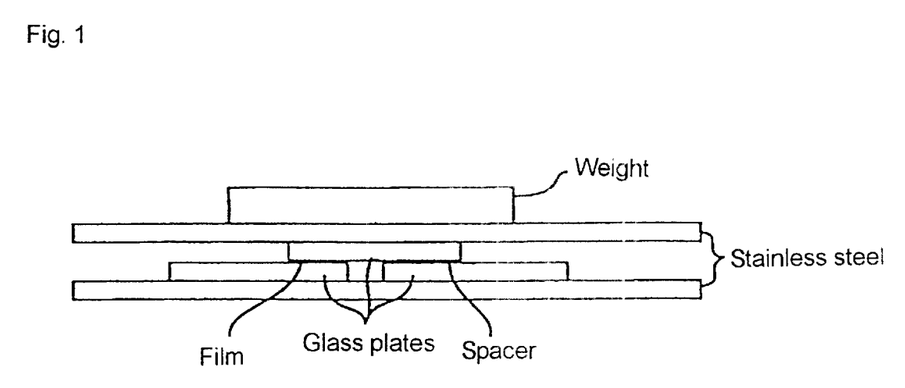
FIG. 1 illustrates a method for the production of a sample used in the measurement of an adhesion strength in Examples.

A sheet having a thickness of 0.4 mm was formed from each of the polymers prepared in Examples 1–4 and Comparative Examples 1–3 in the same manner as in Example 5, and sandwiched between one end of the upper Pyrex (trademark) glass plate and one lower Pyrex (trademark) glass plate (each having a width of 20 mm, a length of 30 mm and a thickness of 5 mm), the abutting end parts of which were laminated one another with a length of 12 mm as shown in FIG. 1. The other end of the upper glass plate and the other lower glass plate were laminated with inserting a FEP film having a thickness of 0.4 mm as a spacer. Then, the laminated glass plates were placed between a pair of stainless steel (SUS) plates, and a weight was placed on the stainless steel plate so that the total pressure of the weight and the stainless steel was 0.18 kg/cm². The whole assembly was heated in an electric furnace at 230° C. (or 300° C. for Comparative Example 3) for 30 minutes to obtain a test piece.

The adhesion strength between the glass plates adhered with the polymer was measured by a tensile shear method.

Figure 2:
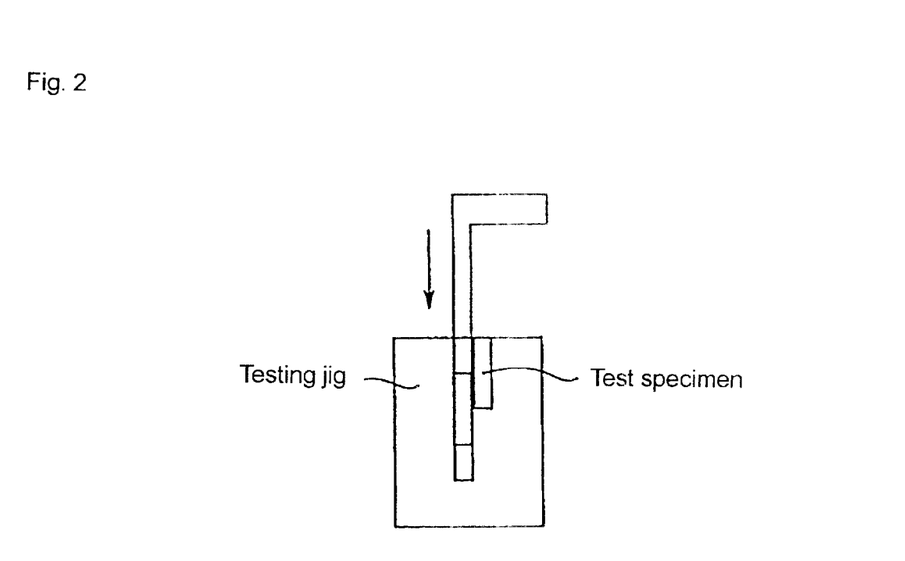
FIG. 2 illustrates a method for measuring an adhesion strength by a tensile shear method.

As shown in FIG. 2, a testing jig, which was designed in accordance with the configuration of the two glass pates adhered with the polymer, was set in an all-purpose Tensilon (manufactured by ORIENTEC KABUSHIKIKAISHA), and subjected to the tensile shear test at a crosshead speed of 20 mm/min. The measured value was the maximum adhesion strength. The results are shown in Table 3.

TABLE 3

|  | Adhesion strength (kgf/cm²) |
| --- | --- |
| Example 1 | 142 (glass fracture) |
| Example 2 | 138 (glass fracture) |
| Example 3 | 102 (glass fracture) |
| Example 4 | 128 (glass fracture) |
| Comp. Ex. 1 | 42 (interface peeling) |
| Comp. Ex. 2 | 9 (interface peeling) |
| Comp. Ex. 3 | 48 (interface peeling) |

EXAMPLE 7

Using a multi-manifold die, a three-kind three-layer tube was produced by co-extruding the resins shown in Table 5 at an extrusion rate of 8 m/min. under the temperature conditions shown in Table 4.

The tube consisted of an inner layer, an intermediate layer and an outer layer, and had an outer diameter of 8 mm and an inner diameter of 6 mm. The inner layer, the intermediate layer and the outer layer had the thickness of 0.2 mm, 0.1 mm and 0.7 mm, respectively.

EXAMPLE 8

Using a multi-manifold die, a two-kind two-layer tube was produced by co-extruding the resins shown in Table 5 at an extrusion rate of 8 m/min. under the temperature conditions shown in Table 4.

The tube consisted of an inner layer and an outer layer, and had an outer diameter of 8 mm and an inner diameter of 6 mm. The inner layer and the outer layer had the thickness of 0.35 mm and 0.65 mm, respectively.

TABLE 4

| Layer | Cylinder temp. (° C.) | Resin temp. (° C.) | Die temp. (° C.) |
| --- | --- | --- | --- |
| Inner layer of Example 7 | 280 290 245 310 | 310 | 245 |
| Intermediate layer of Example 7; Inner layer of Example 8 | 200 220 245 245 | 240 | 245 |
| Outer layer | 220 240 245 245 | 245 | 245 |

Comparative Example 4

A single layer ETFE tube having an inner diameter of 6 mm and a layer thickness of 0.2 mm was produced extrusion. After the surface of the tube was treated with corona discharging, PA 12 was melt coated on the surface at a thickness of 0.8 mm.

The tubes produced in Examples 7 and 8 and Comparative Example 4 were subjected to the following tests.

Peel Strength

A test piece having a width of 5 mm was cut out from each tube, and subjected to the 180 degree peeling test at a pulling rate of 50 mm/min. to measure an adhesion strength between layers.

Barrier Property

Each tube was cut to a length of 30 cm, and filled with Fuel C (a mixture of isooctane/toluene (a volume ratio of 50:50) and methanol in a volume ratio of 85:15, and the both ends were sealed. Then, the sealed tube containing Fuel C was kept standing at 40° C. The weight change was measured, and a fuel penetration rate (a decreased amount of the fuel (g) per 1 m² per day) was calculated.

Low Temperature Impact Strength

Each tube was cut to a length of 20 cm, and maintained at −40° C. for 5 hours. Then, a weight of 450 g was dropped from a height of 30.5 cm on the tube which was maintained at −40° C., and the breakage of the tube was observed. The test was carried on ten test pieces. The result is expressed by "n/10" in which n is the number of broken test pieces.

The results of the above tests are shown in Table 5.

TABLE 5

| | Inner layer | Intermediate layer | Outer layer | Peel strength (N/cm) | Barrier property (g/cm².day) | Low temp. impact strength |
| --- | --- | --- | --- | --- | --- | --- |
| Ex. 7 | ETFE[1] | Copolymer of Ex. 2 | Polyamide[2] | 31.4 | 49 | 0/10 |

TABLE 5-continued

|  | Inner layer | Intermediate layer | Outer layer | Peel strength (N/cm) | Barrier property (g/cm².day) | Low temp. impact strength |
|---|---|---|---|---|---|---|
| Ex. 8 | Copolymer of Ex. 2 | — | Polyamide[2] | 32.6 | 51 | 0/10 |
| Comp. Ex. 4 | ETFE[1] | — | Polyamide[2] | 0.1 | 53 | 0/10 |

Notes:
[1] NEOFLON ETFE EP610 (ethylene-tetrafluoroethylene copolymer manufactured by Daikin Industries, Ltd. melting point: 225° C., viscosity: 2 × $10^4$ poise (at 250° C. and a shear rate of 100 $sec^{-1}$).
[2] PA-12-3035MJ1 (polyamide 12 manufactured by Ube Industries, Ltd. melting point: 174° C., viscosity: 2 × $10^4$ poise (at 260° C. and a shear rate of 100 $sec^{-1}$).

EXAMPLE 9

With the copolymer produced in Example 2 according to the present invention and an ethylene-tetrafluoroethylene copolymer (ETFE), weather resistance, light transmission, adhesion properties, scratch resistance and tear resistance, which are required for use as a surface film of a solar cell, were evaluated.

Weather Resistance

Using a sunshine weather-O-meter, a sample, which was shaped in the form of a test piece according to ASTM D638 (thickness: 500 μm), was exposed for 2,000 hours under the following conditions: Conditions: in an atmosphere at 63° C., 98% humidity. Spraying pure water 18 min./2 hours; Light source: carbon arc.

Tensile strength before and after the exposure was measured with an all-purpose Tensilon (manufactured by ORIENTEC KABUSHIKIKAISHA). The retentions (%) of the maximum tensile strength and elongation at break are used as the measures of weather resistance.

The color difference of the sample between before and after the exposure was measured using a white standard plate with a SM color computer (SM-7) (manufactured by SUGA SHIKENKI KABUSHIKIKAISHA). Color difference ΔE is expressed by the following equation:

$$\Delta E = [(\Delta L)^2 + (\Delta a)^2 + (\Delta b)^2]^{1/2}$$

Light Transmission

The total light transmittance and a HAZE value were measured with a haze meter (manufactured by TOYO SEIKI SEISAKUSHO KABUSHIKIKAISHA).

Condition: Room temperature
Sample thickness: 500 μm
Adhesion Strength with Glass The adhesion strength with glass was measured in the same manner as in Example 6.

Tear Strength of a Film

Figure 4:
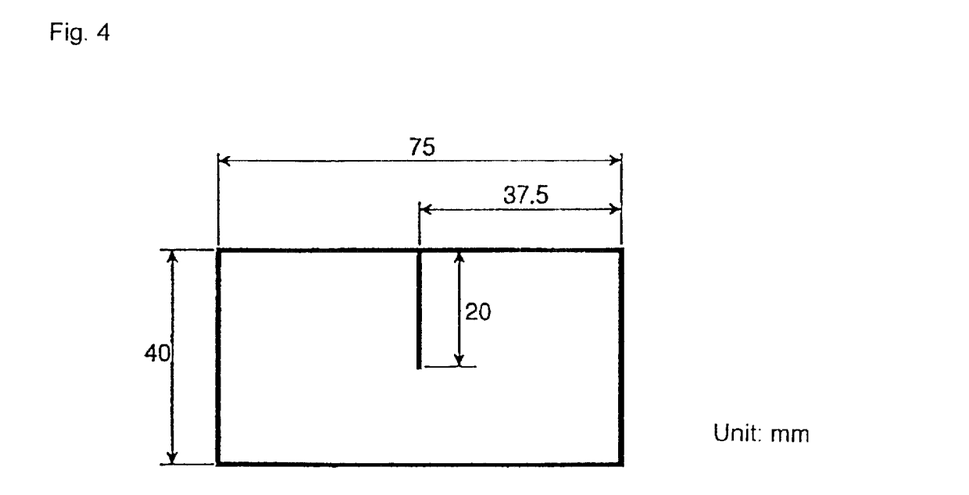
FIG. 4 is a plan view of a sample used in the measurement of a film tearing strength in Examples.

A tear strength of a film was measured with an Elmendorf tear tester. The film thickness was 200 μm. The size and a slit position are shown in FIG. 4.

Film Scratch Test

A film having a thickness of 250 μm was scratched with a blade made of carbon steel by applying a load of 2 pounds on the blade edge, and the scratched state was observed with an eye.

The results are shown in Table 6

TABLE 6

|  | Copolymer of Example 2 | | ETFE[1] | |
|---|---|---|---|---|
| Weather resistance | | | | |
| Retention of tensile strength (%) | 101 | | 102 | |
| Retention of elongation (%) | 102 | | 103 | |
| Light transmission (500 μm thick film) | | | | |
| Total light transmittance (%) | 91.8 | | 72.2 | |
| Haze value | 5.0 | | 54.7 | |
| Adhesion strength with glass (kgf/cm²) | 138 (glass fracture) | | 42 (interface peeling) | |
| File tear strength (kgf/mm) | 14.0 | | 6.2 | |
| Film scratch test | No penetration of scratch | | No penetration of scratch | |
| Color difference | Before exposure | After exposure | Before exposure | After exposure |
| L | 85.70 | 85.59 | 83.45 | 83.21 |
| a | 0.75 | 0.78 | 0.84 | 0.06 |
| b | 4.80 | 4.91 | 2.47 | 2.59 |
| ΔE | 0.16 | | 0.27 | |

Note:
[1] ETFE EP-543 manufactured by Daikin Industries, Ltd.

EXAMPLE 10

Using a three-layer feed block die, a three-kind three-layer film was produced by co-extruding the resins shown in Table 8 at an extrusion rate of 10 m/min. under the temperature conditions shown in Table 7.

The film was a three-layer film consisting of a polyethylene layer (thickness of 0.17 mm), an intermediate layer (Lexpearl RA 3150) (thickness of 0.05 mm), and a layer of the copolymer prepared in Example 2 (thickness of 0.08 mm).

EXAMPLE 11

A three-layer film was formed in the same manner as in Example 10 from the resins shown in Table 8 under the temperature condition of Table 7.

The film consisted of a polyester layer (thickness of 0.17 mm), an intermediate layer (TPAE-8) (thickness of 0.05 mm), and a layer of the copolymer prepared in Example 2 (thickness of 0.08 mm).

TABLE 7

| Layer | Cylinder temp. (° C.) | | | | Resin temp. (° C.) | Die temp. (° C.) |
|---|---|---|---|---|---|---|
| Polyethylene layer of Example 10 | 160 | 220 | 230 | 230 | 228 | 230 |
| Polyester layer of Example 11 | 250 | 260 | 260 | 260 | 260 | 255 |
| Intermediate layer of Example 10 | 160 | 220 | 230 | — | 230 | 230 |
| Intermediate layer of Example 11 | 200 | 220 | 230 | — | 233 | 255 |
| Copolymer layer of Example 10 | 200 | 230 | 230 | — | 230 | 230 |
| Copolymer layer of Example 11 | 200 | 230 | 240 | — | 242 | 255 |

TABLE 8

| | Opposite layer | Intermediate layer | Copolymer layer | Peel strength (N/cm) |
|---|---|---|---|---|
| Ex. 10 | Ube polyethylene[1] L519 | Lexpearl[2] RA 3150 | Copolymer of Ex. 2 | Broken at chucked part at >54.0 |
| Ex. 11 | Dianite[3] KR-560 | TPAE-8[4] | Copolymer of Ex. 2 | Broken at chucked part at >39.2 |

Notes:
[1] Polyethylene resin manufactured by Ube Industries, Ltd.
[2] Polyethylene resin having epoxy groups manufactured by Japan Polyolefin Co., Ltd.
[3] Polyethylene terephthalate resin manufactured by Mitsubishi Rayon Co., Ltd.
[4] Polyamide elastomer (polyether ester elastomer) manufactured by FUJI KASEI KOGYO KABUSHIKIKAISHA.

Measurement of Peel Strength

A test piece having a width of 1 cm was cut out from each film obtained in Examples 10 and 11, and the peel strength between the intermediate layer and the opposite layer was measured by the 180 degree peeling test at a pulling rate of 50 mm/min. The results are shown in Table 8.

What is claimed is:

1. A laminate tube comprising a first layer of a tetrafluoroethylene copolymer and a second layer of a thermoplastic resin which is laminated on a outer surface of said first layer, wherein said tetrafluoroethylene copolymer comprises 30 to 81 mole % of tetrafluoroethylene and 70 to 19 mole % of at least one other monomer, and has terminal carbonate groups at polymer chain ends, a melt flow rate of 0.1 to 100 g/10 min. at 200° C. under a load of 5 kg and a melting point of 90 to 200° C.

2. The laminate tube according to claim 1, which further comprises a third layer of a fluororesin other than said tetrafluoroethylene copolymer, that is laminated on an inner surface of said first layer.

3. The laminate tube according to claim 1, wherein said first layer has antistatic properties.

4. The laminate tube according to claim 2, wherein said third layer has antistatic properties.

5. The laminate tube according to claim 1, which further comprises a third layer of said tetrafluoroethylene copolymer having antistatic properties, that is laminated on an inner surface of said first layer.

6. The laminate tube according to claim 2, which further comprises a fourth layer of a fluororesin other than said tetrafluoroethylene copolymer, that is laminated on an inner surface of said third layer, wherein said fourth layer has antistatic properties.

7. A fuel container made of a laminate comprising a first layer of a tetrafluoroethylene copolymer and a second layer of a thermoplastic resin which is laminated on a outer surface of said first layer, wherein said tetrafluoroethylene copolymer comprises 30 to 81 mole % of tetrafluoroethylene and 70 to 19 mole % of at least one other monomer, and has terminal carbonate groups at polymer chain ends, a melt flow rate of 0.1 to 100 g/10 min. at 200° C. under a load of 5 kg and a melting point of 90 to 200° C.

8. The fuel container according to claim 7, which further comprises a third layer of a fluororesin other than said tetrafluoroethylene copolymer, which is laminated on an inner surface of said first layer.

9. The fuel container according to claim 9, wherein said first layer has antistatic properties.

10. The fuel container according to claim 9, wherein said third layer has antistatic properties.

11. The fuel container according to claim 7, which further comprises a third layer of said tetrafluoroethylene copolymer having antistatic properties, that is laminated on an inner surface of said first layer.

12. The fuel container according to claim 8, which further comprises a fourth layer of a fluororesin other than said tetrafluoroethylene copolymer, that is laminated on an inner surface of said third layer, wherein said fourth layer has antistatic properties.

* * * * *